US008063690B2

(12) United States Patent
Yoshimura et al.

(10) Patent No.: US 8,063,690 B2
(45) Date of Patent: Nov. 22, 2011

(54) LEVEL SHIFT CIRCUIT

(75) Inventors: Tsuyoshi Yoshimura, Sumoto (JP); Taichiro Kawai, Ora-gun (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/786,761

(22) Filed: May 25, 2010

(65) Prior Publication Data

US 2010/0301917 A1    Dec. 2, 2010

(30) Foreign Application Priority Data

May 29, 2009    (JP) .................................. 2009-130045

(51) Int. Cl.
*H03L 5/00* (2006.01)
(52) U.S. Cl. ...................................................... 327/333
(58) Field of Classification Search ........................ None
See application file for complete search history.

(56) References Cited

U.S. PATENT DOCUMENTS

| 5,541,907 A * | 7/1996 | Kurihara et al. ............. 369/53.2 |
| 5,726,963 A * | 3/1998 | Ohta ......................... 369/124.02 |
| 6,188,060 B1 * | 2/2001 | Kim et al. .................. 250/214 R |
| 6,437,723 B1 * | 8/2002 | Otsuka et al. .................. 341/155 |
| 6,606,286 B1 * | 8/2003 | Maekawa .................... 369/47.17 |
| 6,734,639 B2 * | 5/2004 | Chang et al. ................... 315/291 |

FOREIGN PATENT DOCUMENTS

JP            6-104751            4/1994

* cited by examiner

*Primary Examiner* — Lincoln Donovan
*Assistant Examiner* — Khareem E Almo
(74) *Attorney, Agent, or Firm* — Morrison & Foerster LLP

(57) ABSTRACT

The invention provides a level shift circuit that prevents an offset when the supply voltage changes. A level shift circuit has a differential amplification circuit, a current generation circuit, a capacitor and a holding circuit. An input signal from the optical pickup is inputted to the non-inversion input terminal of the differential amplification circuit. First, by turning on a first switch, a feedback loop is formed by the differential amplification circuit, the current generation circuit and the capacitor to perform a level shift, and the voltage charged in the capacitor is held by the holding circuit. Then by turning off the first switch and turning on a second switch, the voltage held by the holding circuit is applied to the non-inversion input terminal of the differential amplification circuit to perform a level shift.

3 Claims, 3 Drawing Sheets

Input signal Vin $VREF1 = \dfrac{VDD1}{2}$

Output signal Vout $VREF2 = \dfrac{VDD2}{2}$

Input signal Vin $VREF1 = \dfrac{VDD1}{2}$

Output signal Vout (feedback control only)

$VREF2 = \dfrac{VDD2}{2}$

Output signal Vout (feedback control + holding circuit)

$VREF2 = \dfrac{VDD2}{2}$

US 8,063,690 B2

LEVEL SHIFT CIRCUIT

CROSS-REFERENCE OF THE INVENTION

This application claims priority from Japanese Patent Application No. 2009-130045, the content of which is incorporated herein by reference in its entirety.

BACKGROUND OF THE INVENTION

1. Field of the Invention

The invention relates to a level shift circuit, in particular, a level shift circuit using a differential amplification circuit.

2. Description of the Related Art

An optical pickup (a recording reproducing component) is used in a recording reproducing device that reproduces data recorded in an optical disk such as a DVD or a CD. A signal from the optical pickup is processed by a signal processing LSI. When the supply voltage of the optical pickup and the supply voltage of the signal processing LSI are different, it is necessary to shift the signal from the optical pickup by a level shift circuit and input it to the signal processing LSI.

When a signal from a 5V type optical pickup is to be processed by a 3.3V type signal processing LSI, the shifting amount by the level shift circuit is so small that it does not exceed the threshold of a normal transistor. For example, when the direct current level of the signal from the 5V type optical pickup is 2.1 V, the direct current level of the signal of the 3.3V type signal processing LSI is shifted to 1.65 V. The shifting amount in this case is 0.45 V.

Therefore, the level shift circuit is configured using a differential amplification circuit instead of using a source follower circuit. In this case, the signal from the optical pickup is applied to the non-inversion input terminal of the differential amplification circuit, and the reference voltage (e.g. 3.3 V/2=1.65 V) of the 3.3V type signal processing LSI is applied to the inversion input terminal thereof.

A relevant technology is described in Japanese Patent Application No. Hei 6-104751.

However, in the level shift circuit using the differential amplification circuit, the signal level inputted to the non-inversion input terminal of the differential amplification circuit depends on the variation of the supply voltage of the optical pickup, while the reference voltage inputted to the inversion input terminal of the differential amplification circuit depends on the variation of the supply voltage of the signal processing LSI. Therefore, when these supply voltages respectively change to the opposite sides, i.e., when one changes to the negative side and the other changes to the positive side, there occurs a problem that the direct current level of the output signal of the differential amplification circuit changes largely.

It means that a large offset occurs in the direct current level of the output signal of the differential amplification circuit (a shift from the predetermined direct current level) to cause the malfunction of the signal processing LSI.

SUMMARY OF THE INVENTION

The invention provides a level shift circuit that includes a differential amplification circuit having an inversion input terminal, a non-inversion input terminal and an output terminal. The inversion input terminal receives a reference voltage, the non-inversion input terminal receives an input signal and the output terminal outputs an output signal. The level shift circuit also includes a feedback resistor connected between the output terminal and the inversion input terminal of the differential amplification circuit, a current generation circuit generating an electric current in response to the reference voltage and the output signal of the differential amplification circuit, a capacitor connected to an output terminal of the current generation circuit so as to be charged with an electric current generated by the current generation circuit to induce a voltage in the capacitor, a holding circuit generating and holding the induced voltage in the holding circuit, and a switching circuit switching from a first state where the voltage induced in the capacitor is applied to the non-inversion input terminal of the differential amplification circuit to a second state where the voltage held in the holding circuit is applied to the non-inversion input terminal of the differential amplification circuit.

DETAILED DESCRIPTION OF THE INVENTION

Figure 1:
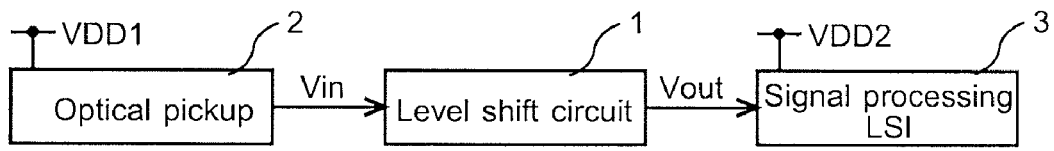
FIG. 1 is a diagram showing a structure of a recording reproducing device.

An embodiment of the invention will be described referring to figures. As shown in FIG. 1, in a recording reproducing device that reproduces data recorded in an optical disk such as a DVD or a CD, an input signal Vin from an optical pickup 2 is shifted by a level shift circuit 1. An output signal Vout of the level shift circuit 1 is inputted to a signal processing LSI 3. The signal processing LSI 3 processes the output signal Vout of the level shift circuit 1, and reproduces sound or images recorded in the optical disk. The supply voltage of the optical pickup 2 is VDD1, and the supply voltage of the signal processing LSI 3 is VDD2.

Figure 2:
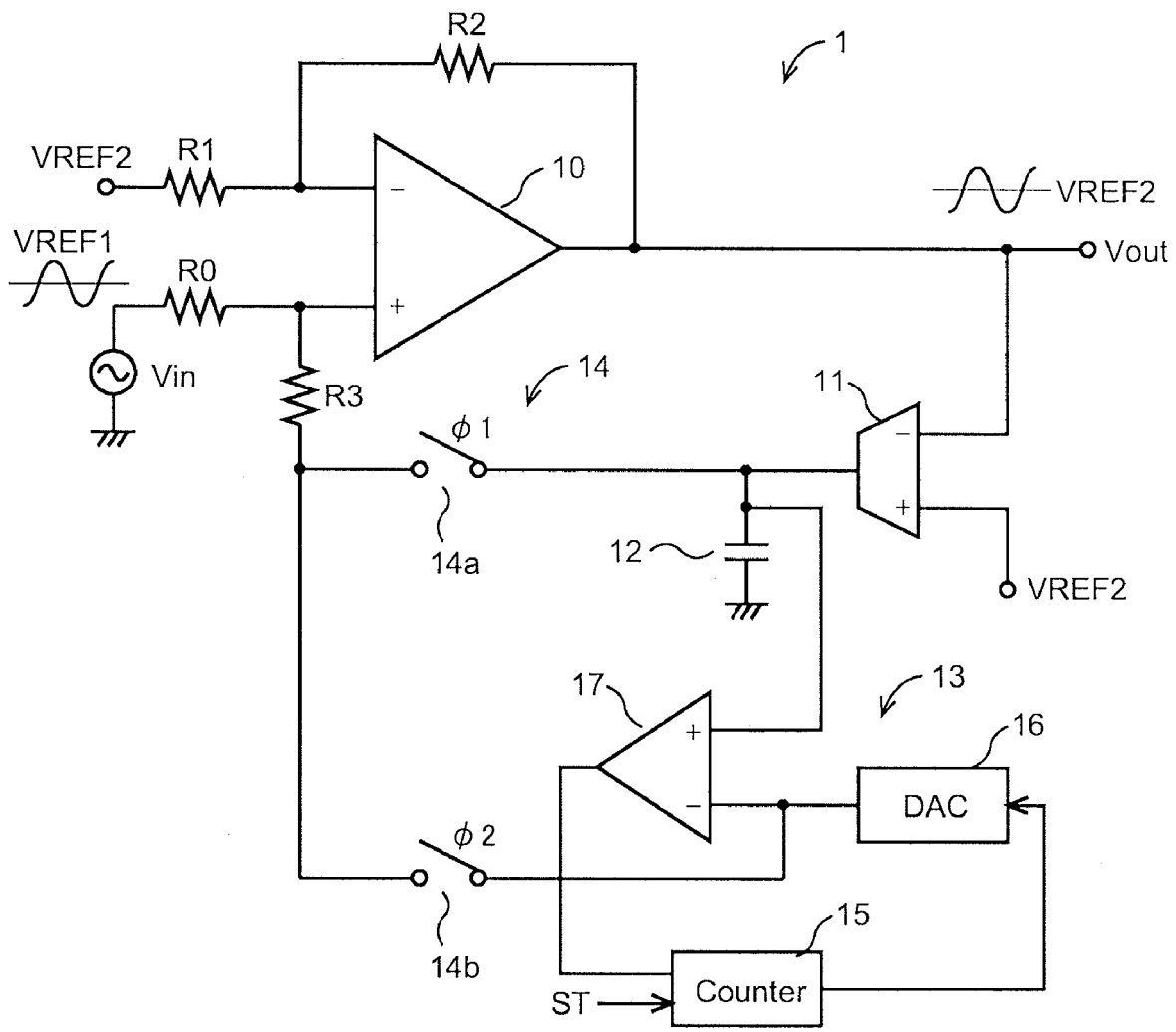
FIG. 2 is a circuit diagram of a level shift circuit of an embodiment of the invention.

FIG. 2 is the circuit diagram of the level shift circuit 1. The level shift circuit 1 is configured including a differential amplification circuit 10, a current generation circuit 11, a capacitor 12, a holding circuit 13, a switching circuit 14 and resistors R0 to R3.

The alternating input signal Vin from the optical pickup 2 is applied to the non-inversion input terminal (+) of the differential amplification circuit 10 through the resistor R0. In this case, the direct current level of the input signal Vin is a reference voltage VREF1 that depends on the supply voltage VDD1 of the optical pickup 2. The VREF1 is set to VDD1/2 or a value slightly lower than VDD1/2, for example. On the other hand, a reference voltage VREF2 is applied to the inversion input terminal (−) of the differential amplification circuit 10 through the resistor R1. The reference voltage VREF2 is set to VDD2/2, for example. The feedback resistor R2 is connected between the inversion input terminal (−) and the output terminal of the differential amplification circuit 10.

The current generation circuit 11 is a circuit that generates an electric current corresponding to a difference voltage between the output signal Vout of the differential amplification circuit 10 and the reference voltage VREF2. The capacitor 12 is connected to the output terminal of the current generation circuit 11, and charged with an electric current generated from the output terminal of the current generation circuit 11. The output signal Vout of the differential amplification circuit 10 is the output signal of the level shift circuit 1.

Figure 3:
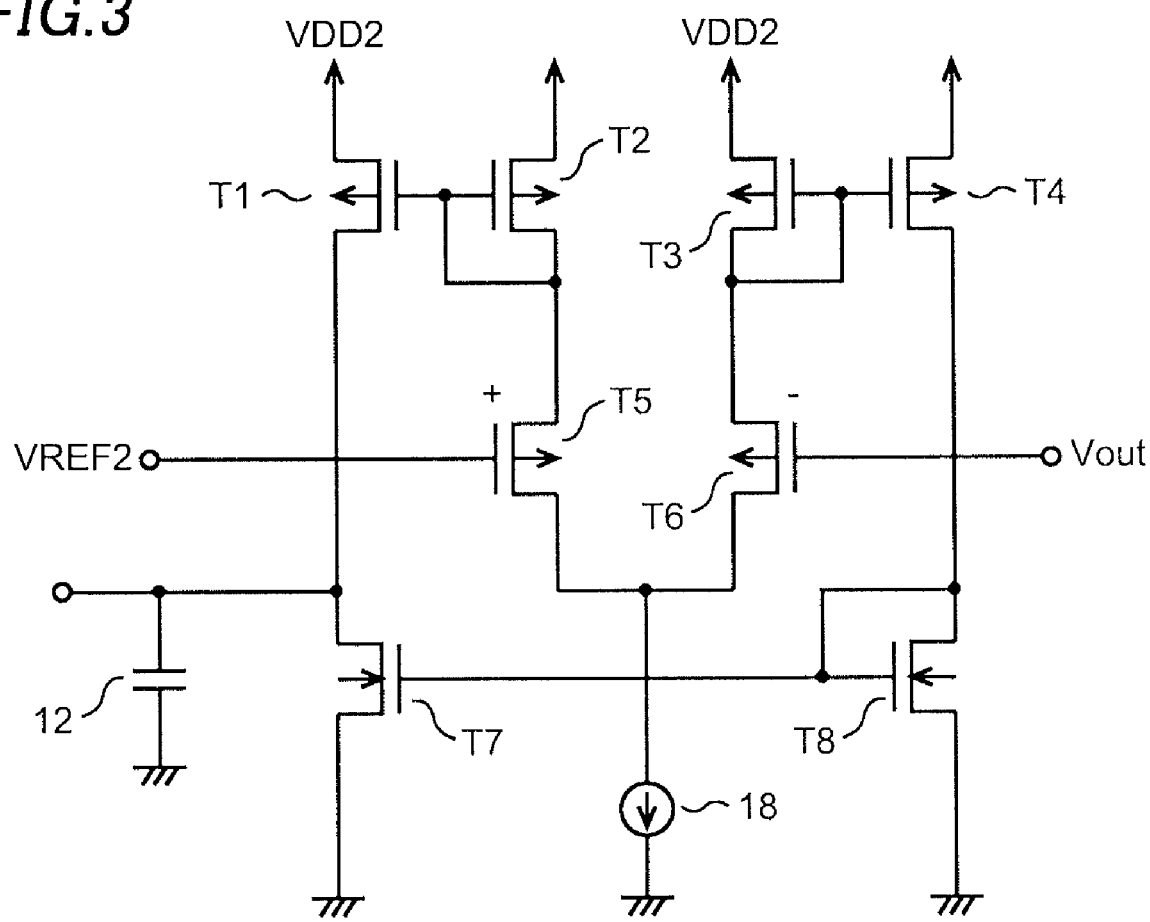
FIG. 3 is a circuit diagram of a current generation circuit.

FIG. 3 is a circuit diagram showing an example of the detailed structure of the current generation circuit 11. As shown in the figure, the current generation circuit 11 includes P-channel type MOS transistors T1 to T6, N-channel type MOS transistors T7 and T8, and a constant current source 18. T5 and T6 form a differential pair, and the reference voltage VREF2 is applied to the gate of T5 and the output signal Vout of the differential amplification circuit 10 is applied to the gate of T6. T1 and T2, T3 and T4, and T7 and T8 form current mirrors respectively. The constant current source 18 is connected to the common drain of T5 and T6. The connection node of T1 and T7 is the output terminal of the current generation circuit 11.

As shown in FIG. 2, the holding circuit 13 is a circuit that holds the voltage charged in the capacitor 12, and has a counter 15, a DA converter 16 that converts the count value (the digital value) of the counter 15 to an analog voltage, and a comparator 17 that compares the analog voltage outputted from the DA converter 16 and the voltage charged in the capacitor 12.

The counter 15 starts counting when a start signal ST becomes high level, and the analog voltage of the DA converter 16 increases according as the count value increases. Then when the analog voltage becomes larger than the voltage charged in the capacitor 12, the output of the comparator 17 is inverted from high level to low level. When the output of the comparator 17 is inverted, the count value decreases. When the count value decreases, the analog voltage of the DA converter 16 decreases accordingly. Then when the analog voltage becomes smaller than the voltage charged in the capacitor 12, the output of the comparator 17 is inverted from low level to high level again. By the repetition of this operation, the analog voltage and the voltage charged in the capacitor 12 become equal substantially. Then when the start signal ST becomes low level, the counter 15 stops operation and holds the count value.

In detail, the counter 15 has a structure of a register that holds such a count value that the analog voltage of the DA converter 16 and the voltage charged in the capacitor 12 become equal. By this, the voltage charged in the capacitor 12 is held as the analog voltage of the DA converter 16. It is noted that the counter 15 is reset when the recording reproducing device is powered on.

The switching circuit 14 has a first switch 14a provided between the resistor R3 connected to the non-inversion input terminal (+) of the differential amplification circuit 10 and the capacitor 12, and a second switch 14b provided between the resistor R3 connected to the non-inversion input terminal (+) of the differential amplification circuit 10 and the holding circuit 13.

The first switch 14a is controlled by a control signal φ1, and turned on when the control signal φ1 is high level and turned off when the control signal φ1 is low level. The second switch 14b is controlled by a control signal φ2, and turned on when the control signal φ2 is high level and turned off when the control signal φ2 is low level. The first switch 14a and the second switch 14b switch complementarily, and when one is turned on the other is turned off.

Figure 4:
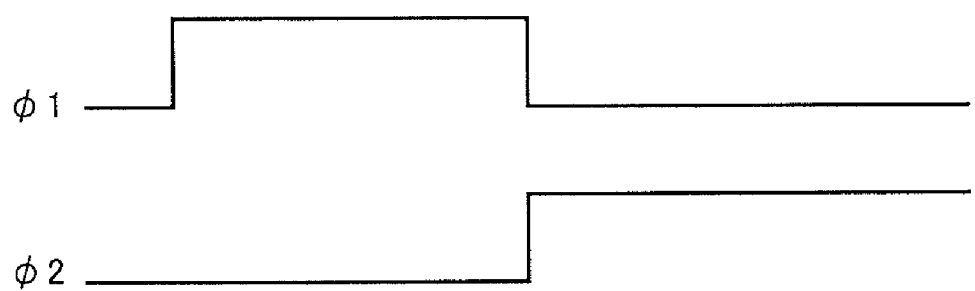
FIG. 4 is an operation timing chart of a switching circuit.

Hereafter, an example of the operation of the level shift circuit 1 will be described referring to FIGS. 4 to 6C. As shown in FIG. 4, first, in the state where the input signal Vin from the optical pickup 2 is applied, the control signal φ1 of the first switch 14a is set to high level, and the control signal φ2 of the second switch 14b is set to low level.

Then the first switch 14a is turned on, and the second switch 14b is turned off. In this state, the output terminal of the current generation circuit 11 and the capacitor 12 are connected to the non-inversion input terminal (+) of the differential amplification circuit 10 through the resistor R3. At this time, the output signal Vout of the differential amplification circuit 10 is inputted to the current generation circuit 11, and the output of the current generation circuit 11 is applied to the non-inversion input terminal (+) of the differential amplification circuit 10, so that a feedback loop is formed.

By this, a feedback control is performed so that the direct current level of the output signal Vout of the differential amplification circuit 10 becomes equal to the VREF2. In this case, the capacitor 12 is charged with such a voltage that the direct current level of the output signal Vout of the differential amplification circuit 10 becomes equal to the reference voltage VREF2. The voltage charged in this capacitor 12 is held by the holding circuit 13. In detail, the counter 15 starts counting in response to the start signal ST, and the counter 15 operates so that the analog voltage of the DA converter 16 becomes equal to the voltage charged in the capacitor 12. Then when the start signal ST is inverted, the counter 15 stops and holds the count value at that time.

Figure 5A:
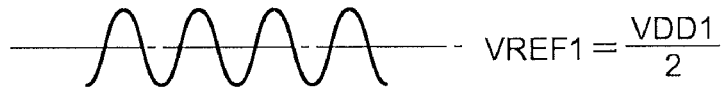
FIGS. 5A and 5B are waveforms for explaining the operation of the level shift circuit of the embodiment of the invention.
Figure 5B:
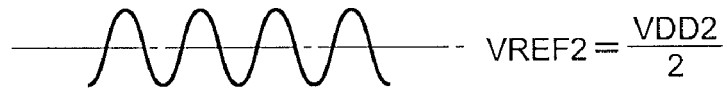

Then the control signal φ1 of the first switch 14a is turned to low level, and the control signal φ2 of the second switch 14b is turned to high level. Then the first switch 14a is turned off, and the second switch 14b is turned on. By this, the analog voltage held by the holding circuit 13 is applied to the non-inversion input terminal (+) of the differential amplification circuit 10 through the resistor R3, and the direct current level of the output signal Vout of the differential amplification circuit 10 is stabilized at the reference voltage VREF2 (=VDD2/2). In detail, as shown in FIGS. 5A and 5B, the direct current level of the input signal Vin from the optical pickup 2 is the reference voltage VREF1, while the direct current level of the output signal Vout of the level shift circuit 1 is shifted to the reference voltage VREF2.

In this manner, with the level shift circuit 1, by turning on the first switch 14a first, the differential amplification circuit 10, the current generation circuit 11 and the capacitor 12 form a feedback loop to perform a level shift, and the voltage charged in the capacitor 12 is held by the holding circuit 13. Then by turning off the first switch 14a and turning on the second switch 14b, the voltage held by the holding circuit 13 is applied to the differential amplification circuit 10 to perform a level shift.

With the level shift circuit 1, by the feedback control, the level shift is realized independent of the value of the supply voltage VDD1 of the optical pickup 2. It means that an offset is prevented. Furthermore, since the output signal Vout of the level shift circuit 1 is usable as it is, independent of the value of the supply voltage VDD1 (e.g. 5V, 3.3V) of the optical pickup 2, since it is independent of the value of the supply voltage VDD1 of the optical pickup 2.

With the level shift circuit 1, the voltage charged in the capacitor 12 by the feedback control is held by the holding circuit 13, and the constant voltage held by the holding circuit 13 is applied to the non-inversion input terminal (+) of the differential amplification circuit 10. The reason for this structure will be described referring to FIGS. 6A to 6C.

Figure 6A:
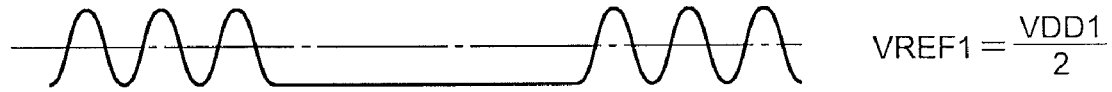
FIGS. 6A, 6B and 6C are waveforms for explaining the operation of the level shift circuit of the embodiment of the invention.
Figure 6B:

As shown in FIG. 6A, when the record surface of a CD or a DVD has a physical damage, the input signal Vin from the optical pickup 2 may be fixed to a lower direct current level than the reference voltage VREF1 temporarily. When the feedback control described above is continued during this error period of the input signal Vin, the level of the output signal Vout is controlled so as to change corresponding to the reference voltage VREF2 as shown in FIG. 6B. Then when the input signal Vin from the optical pickup 2 turns back to the normal state, the direct current level of the output signal Vout becomes extraordinarily larger than the reference voltage VREF2 for an instant, causing a problem of disturbance of reproduced sound or images.

Figure 6C:

With the level shift circuit 1, since the level shift is performed using the constant voltage held by the holding circuit 13 after the feedback control, the level of the output signal Vout does not change corresponding to the reference voltage VREF2 during the error period of the input signal Vin, and after the input signal Vin turns back to the normal state, the direct current level of the output signal Vout is kept at the reference voltage VREF2 as shown in FIG. 6C.

What is claimed is:

1. A level shift circuit comprising:
    a differential amplification circuit comprising an inversion input terminal, a non-inversion input terminal and an output terminal, the inversion input terminal receiving a reference voltage, the non-inversion input terminal receiving an input signal and the output terminal outputting an output signal;
    a feedback resistor connected between the output terminal and the inversion input terminal of the differential amplification circuit;
    a current generation circuit generating an electric current corresponding to a difference voltage between the reference voltage and the output signal of the differential amplification circuit;
    a capacitor connected to an output terminal of the current generation circuit so as to be charged with the electric current generated by the current generation circuit to induce a voltage in the capacitor;
    a holding circuit generating and holding the induced voltage in the capacitor; and
    a switching circuit switching from a first state where the voltage induced in the capacitor is applied to the non-inversion input terminal of the differential amplification circuit to a second state where the voltage held in the holding circuit is applied to the non-inversion input terminal of the differential amplification circuit,
    wherein the holding circuit comprises a counter, a DA converter converting a count value of the counter to an analog voltage, and a comparator comparing the analog voltage outputted from the DA converter and the voltage induced in the capacitor, and the counter holds the count value when the analog voltage and the voltage induced in the capacitor become equal.

2. The level shift circuit of claim 1, wherein the switching circuit comprises a first switch connected between the capacitor and the non-inversion input terminal of the differential amplification circuit, and a second switch connected between the holding circuit and the non-inversion input terminal of the differential amplification circuit.

3. The level shift circuit of claim 1, wherein the input signal is a signal from an optical pickup.

* * * * *